United States Patent
Liu et al.

(10) Patent No.: US 8,759,139 B2
(45) Date of Patent: Jun. 24, 2014

(54) BURIED SELECTIVE EMITTER FORMATION FOR PHOTOVOLTAIC DEVICES UTILIZING METAL NANOPARTICLE CATALYZED ETCHING

(75) Inventors: Jun Liu, Irvington, NY (US); Qiang Huang, Croton on Hudson, NY (US); Young-Hee Kim, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 408 days.

(21) Appl. No.: 13/212,740

(22) Filed: Aug. 18, 2011

(65) Prior Publication Data
US 2013/0045562 A1 Feb. 21, 2013

(51) Int. Cl.
*H01L 31/18* (2006.01)
(52) U.S. Cl.
USPC .......................................................... 438/72
(58) Field of Classification Search
CPC ............ H01L 31/03529; H01L 31/068; H01L 31/1804; Y02E 10/547
USPC ......................................... 438/72; 257/E31.12
See application file for complete search history.

(56) References Cited

U.S. PATENT DOCUMENTS

| | | | |
|---|---|---|---|
| 2009/0236317 A1* | 9/2009 | Yost et al. | 216/99 |
| 2010/0221866 A1* | 9/2010 | Graham et al. | 438/73 |

* cited by examiner

*Primary Examiner* — Walter H Swanson
(74) *Attorney, Agent, or Firm* — Scully, Scott, Murphy & Presser, P.C.; Louis J. Percello, Esq.

(57) ABSTRACT

A method of forming a photovoltaic device containing a buried emitter region and vertical metal contacts is provided. The method includes forming a plurality of metal nanoparticles on exposed portions of a single-crystalline silicon substrate that are not covered by patterned antireflective coatings (ARCs). A metal nanoparticle catalyzed etching process is then used to form trenches within the single-crystalline silicon substrate and thereafter the metal nanoparticles are removed from the trenches. An emitter region is then formed within exposed portions of the single-crystalline silicon substrate, and thereafter a metal contact is formed atop the emitter region.

27 Claims, 4 Drawing Sheets

BURIED SELECTIVE EMITTER FORMATION FOR PHOTOVOLTAIC DEVICES UTILIZING METAL NANOPARTICLE CATALYZED ETCHING

BACKGROUND

The present disclosure relates to semiconductor manufacturing, and more particularly to a method of forming a photovoltaic device including a buried emitter and a vertical metal contact.

A photovoltaic device is a device that converts the energy of incident photons to electromotive force (e.m.f.). Typical photovoltaic devices include solar cells, which are configured to convert the energy in the electromagnetic radiation from the Sun to electric energy. Each photon has an energy given by the formula E=hv, in which the energy E is equal to the product of the Plank constant h and the frequency v of the electromagnetic radiation associated with the photon.

A photon having energy greater than the electron binding energy of a matter can interact with the matter and free an electron from the matter. While the probability of interaction of each photon with each atom is probabilistic, a structure can be built with a sufficient thickness to cause interaction of photons with the structure with high probability. When an electron is knocked off an atom by a photon, the energy of the photon is converted to electrostatic energy and kinetic energy of the electron, the atom, and/or the crystal lattice including the atom. The electron does not need to have sufficient energy to escape the ionized atom. In the case of a material having a band structure, the electron can merely make a transition to a different band in order to absorb the energy from the photon.

The positive charge of the ionized atom can remain localized on the ionized atom, or can be shared in the lattice including the atom. When the positive charge is shared by the entire lattice, thereby becoming a non-localized charge, this charge is described as a hole in a valence band of the lattice including the atom. Likewise, the electron can be non-localized and shared by all atoms in the lattice. This situation occurs in a semiconductor material, and is referred to as photogeneration of an electron-hole pair. The formation of electron-hole pairs and the efficiency of photogeneration depend on the band structure of the irradiated material and the energy of the photon. In case the irradiated material is a semiconductor material, photogeneration occurs when the energy of a photon exceeds the band gap energy, i.e., the energy difference of the conduction band and valence band.

The direction of travel of charged particles, i.e., the electrons and holes, in an irradiated material is sufficiently random (known as carrier "diffusion"). Thus, in the absence of an electric field, photogeneration of electron-hole pairs merely results in heating of the irradiated material. However, an electric field can break the spatial direction of the travel of the charged particles to harness the electrons and holes formed by photogeneration.

One exemplary method of providing an electric field is to form a p-n or p-i-n junction around the irradiated material. Due to the higher potential energy of electrons (corresponding to the lower potential energy of holes) in the p-doped material with respect to the n-doped material, electrons and holes generated in the vicinity of the p-n junction will drift to the n-doped and p-doped regions, respectively. Thus, the electron-hole pairs are collected systematically to provide positive charges at the p-doped region and negative charges at the n-doped region. The p-n or p-i-n junction forms the core of this type of photovoltaic device, which provides electromotive force that can power a device connected to the positive node at the p-doped region and the negative node at the n-doped region.

In a typical solar cell device, buried selective emitter processes have been used to form a buried emitter within a semiconductor substrate. In prior art buried selective emitter processes, expensive equipment and materials such as, for example, reactive ion etching or laser etching have been used. Due to the expensive equipment and materials required in prior art buried selective emitter processes, there has been a reluctance in the industry for using such technology.

Wet chemical etching of silicon is very cheap and a viable solution to the increased costs associated with prior art buried selective emitter processes. However, wet chemical etching of silicon is isotropic and, as such, an undesirable undercut is provided within the silicon substrate that extends beneath patterned antireflective coatings which are located on a surface of the silicon substrate. This leads to the difficulty of metal contact shape design and Si area consumption.

SUMMARY

The present disclosure provides a method for forming a buried emitter and a vertical metal contact within a single-crystalline silicon substrate that avoids reactive ion etching and laser etching as well forming an undercut within the single-crystalline silicon substrate. In the present disclosure, metal nanoparticles and a metal nanoparticle catalyzed etching process are used to define deep (up to 50 μm) trenches within the single-crystalline silicon substrate. An emitter region is then formed into exposed wall portions of the single-crystalline silicon substrate within the trenches and then a vertical metal contact is formed.

In one embodiment, the method of the present disclosure includes forming a plurality of metal nanoparticles on exposed portions of a single-crystalline silicon substrate that are not covered by patterned antireflective coatings (ARCs). A metal nanoparticle catalyzed etching process is then used to form trenches within the single-crystalline silicon substrate and thereafter the metal nanoparticles are removed from the trenches. An emitter region is then formed into exposed wall portions of the single-crystalline silicon substrate, and thereafter a metal contact is formed atop the emitter region.

In another embodiment, the method of the present disclosure includes providing a single-crystalline silicon substrate having an n-type single-crystalline silicon portion and a p-type single-crystalline silicon portion located one atop another, wherein the n-type single-crystalline silicon portion has an n-type single-crystalline silicon surface and the p-type single-crystalline silicon portion has a p-type single-crystalline silicon surface. One or more layers of patterned antireflective coatings (ARCs) are then formed on portions of the n-type single-crystalline silicon surface, while leaving other portions of the n-type single-crystalline silicon surface exposed. A plurality of metal nanoparticles is then formed on the other portions of the n-type single-crystalline silicon surface that are exposed and thereafter trenches are formed within the other portions of the n-type single-crystalline silicon surface that are exposed by utilizing a metal nanoparticle catalyzed etching process. In accordance with the present disclosure, the trenches extend into the n-type single-crystalline silicon portion and the p-type single-crystalline silicon portion of the single-crystalline silicon substrate. After forming the trenches, metal nanoparticles are removed from the trenches, and then an n-type emitter region is formed within exposed wall portions of the n-type single-crystalline silicon portion and the p-type single-crystalline silicon portion of the single-crystalline silicon substrate. Next, a metal contact is formed atop the n-type emitter region.

DETAILED DESCRIPTION

The present disclosure, which provides a method of forming a photovoltaic device including a buried emitter utilizing a metal nanoparticle catalyzed etching process, will now be described in greater detail by referring to the following discussion and drawings that accompany the present application. It is noted that the drawings are provided for illustrative purposes only and are not drawn to scale.

In the following description, numerous specific details are set forth, such as particular structures, components, materials, dimensions, processing steps and techniques, in order to illustrate the present disclosure. However, it will be appreciated by one of ordinary skill in the art that various embodiments of the present disclosure may be practiced without these, or with other, specific details. In other instances, well-known structures or processing steps have not been described in detail in order to avoid obscuring the various embodiments of the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
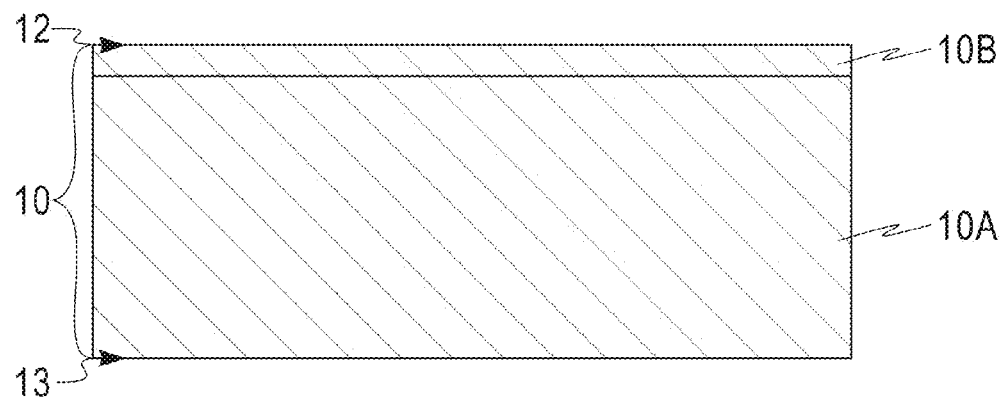
FIG. 1 is a pictorial representation (through a cross sectional view) illustrating an initial structure including a single-crystalline silicon substrate having an n-type single-crystalline silicon portion atop a p-type single-crystalline silicon portion that can be employed in one embodiment of the present disclosure.

Referring now to FIG. 1, there is illustrated an initial structure that can be employed in one embodiment of the present disclosure. The initial structure illustrated in FIG. 1 includes a single-crystalline silicon substrate 10 having a p-type single-crystalline silicon portion and a n-type single-crystalline silicon portion one atop the other. The terms "single-crystalline or mono-crystalline silicon" denote any silicon substrate in which the crystal lattice of the entire substrate is continuous and unbroken to the edges of the substrate, with no grain boundaries.

In one embodiment and for a p-type silicon photovoltaic device, the single-crystalline silicon substrate 10 includes a p-type single-crystalline silicon portion 10A with an n-type single-crystalline silicon portion (i.e., n-type emitter) 10B on top. This embodiment is illustrated in FIG. 1. In some embodiments (not shown) for an n-type silicon photovoltaic device, the single-crystalline silicon substrate includes an n-type single-crystalline silicon portion with a p-type single-crystalline silicon portion (i.e., p-type emitter) on top.

For clarity, the following description will be based on a p-type silicon photovoltaic device with an n-type emitter on the front side only. It is noted that the method disclosed herein for trench formation of the buried emitter/metal contact would be similar in the case of an n-type silicon photovoltaic device with a p-type emitter on the front side. In the latter case, the buried emitter would be p-type doped instead of n-type doped as described below. Also, and in the latter case, the patterned ARCs and metal nanoparticles would be formed on the p-type single-crystalline silicon portion of the substrate.

As is illustrated in FIG. 1, the n-type single-crystalline silicon portion 10B has an n-type single-crystalline silicon surface 12 and the p-type single-crystalline silicon portion 10A has a p-type single-crystalline silicon surface 13 that is opposite the n-type single-crystalline silicon surface 12. In the embodiment illustrated, the n-type single-crystalline silicon surface 12 is the front side surface of single-crystalline silicon substrate 10, while the p-type single-crystalline silicon surface 13 is the back side surface of the single-crystalline silicon substrate 10. In another embodiment (not specifically shown) for an n-type photovoltaic device, the front side surface of the single-crystalline silicon substrate can be a p-type single-crystalline surface, while the back side surface of the single-crystalline silicon substrate can be an n-type single-crystalline surface.

The term "n-type dopant" is used throughout the present disclosure to denote an atom from Group VA of the Periodic Table of Elements including, for example, P, As and/or Sb. The term "p-type dopant" is used throughout the present disclosure to denote an atom from Group IIIA of the Periodic Table of Elements including, for example, B, Al, Ga and/or In.

The concentration of dopant within each single-crystalline silicon portion of single-crystalline silicon substrate 10 may vary depending on the ultimate end use of the semiconductor material and the type of dopant atom being employed. The p-type single-crystalline silicon portion 10A of the single-crystalline silicon substrate 10 typically has a p-type dopant concentration from 1e15 atoms/cm$^3$ to 1e17 atoms/cm$^3$, with a p-type dopant concentration from 5e15 atoms/cm$^3$ to 5e16 atoms/cm$^3$ being more typical. The n-type single-crystalline silicon portion 10B of the single-crystalline silicon substrate 10 typically has an n-type dopant concentration from 1e16 atoms/cm$^3$ to 1e22 atoms/cm$^3$, with an n-type dopant concentration from 1e19 atoms/cm$^3$ to 1e21 atoms/cm$^3$ being more typical. The sheet resistance of the n-type single-crystalline silicon portion 10B is typically greater than 50 ohm/sq, with a sheet resistance range of the n-type single-crystalline silicon portion 10B from 60 ohm/sq to 200 ohm/sq being more typical.

The dopant (n-type and/or p-type) can be introduced into an initial doped or undoped single-crystalline silicon material using techniques well known to those skilled. For example, the n-type and/or p-type dopant can be introduced into a single-crystalline silicon material by ion implantation, gas phase doping, liquid solution spray/mist doping, and/or out-diffusion of a dopant atom from an overlying sacrificial dopant material layer that can be formed on the substrate, and removed after the out-diffusion process. In some embodiments of the present disclosure, the dopant(s) can be introduced into the single-crystalline silicon substrate 10 during the formation thereof. For example, an in-situ epitaxial growth process can be used to form a doped single-crystalline silicon substrate.

Figure 2:
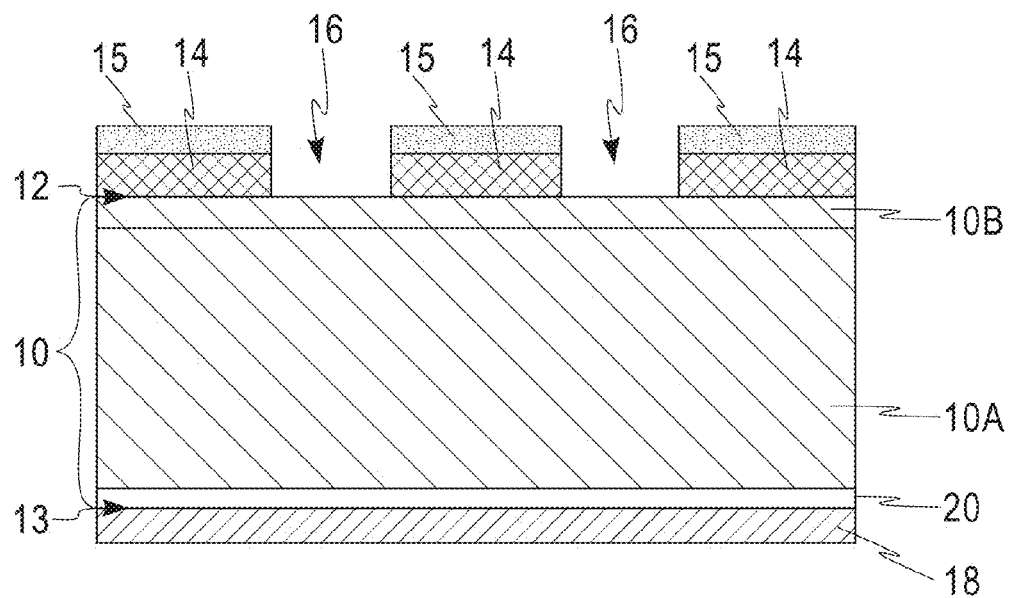
FIG. 2 is a pictorial representation (through a cross sectional view) illustrating the initial structure of FIG. 1 after forming one or more layers of patterned antireflective coatings (ARCs) on a surface of the n-type single-crystalline silicon portion of the single-crystalline silicon substrate.

Referring now to FIG. 2, there is illustrated the structure of FIG. 1 after forming one or more layers of patterned antireflective coatings (ARCs) 14 on the n-type single-crystalline silicon surface 12 of the single-crystalline silicon substrate 10 (only the case of one layer of ARC is shown in FIG. 2). In some embodiments and as shown, a protective coating 15 is optionally present atop each of the patterned ARCs 14. The protective coating 15 can be any material that is more resistive to a metal nanoparticle catalyzed etching process as compared to the ARC material. Illustrative examples of materials that can be used as the protective coating 15 include a photoresist material, an organic material, a hard mask material or a multilayered stack of one or more of the aforementioned materials.

The patterned ARCs 14 is formed by first forming a blanket layer of ARC material on the n-type single-crystalline silicon surface 12 of the single-crystalline silicon substrate 10. The blanket layer of ARC material that can be employed in the present disclosure includes a conventional ARC material such as, for example, an inorganic ARC or an organic ARC. In one embodiment of the present disclosure, the ARC material comprises silicon nitride. The blanket layer of ARC material can be formed utilizing techniques well known to those skilled in the art. For example, an ARC composition can be applied to the n-type single-crystalline silicon surface 12 of the single-crystalline silicon substrate 10 (i.e., directly onto the exposed surface of the n-type single-crystalline silicon portion 10B in the embodiment illustrated in the drawings) utilizing a conventional deposition process including, for example, spin-on coating, dip coating, evaporation, chemical solution deposition, chemical vapor deposition (CVD), and plasma enhanced chemical vapor deposition (PECVD). After application of the ARC composition, particularly those from a liquid phase, a post deposition baking step is usually employed to remove unwanted components, such as solvent, and to effect crosslinking. The post deposition baking step of the ARC composition is typically, but not necessarily always, performed at a temperature from 80° C. to 300° C., with a baking temperature from 120° C. to 200° C. being more typical.

In some embodiments, the as-deposited ARC composition may be subjected to a post deposition treatment to improve the properties of the entire layer or the surface of the ARC. This post deposition treatment can be selected from heat treatment, irradiation of electromagnetic wave (such as ultraviolet light), particle beam (such as an electron beam, or an ion beam), plasma treatment, chemical treatment through a gas phase or a liquid phase (such as application of a monolayer of surface modifier) or any combination thereof. This post-deposition treatment can be blanket or pattern-wise.

After forming the blanket layer of ARC material, the above mentioned protective coating 15 can be formed on the blanket layer of ARC material utilizing techniques well known in the art. In some embodiments, when a photoresist is used as the protective coating, the photoresist is also used to pattern the ARCs as described below. In other embodiments in which the protective coating is other than a photoresist material, the non-photoresist containing protective coating 15 is first formed and then a photoresist is used to pattern the non-photoresist containing protective coating and the underlying blanket layer of ARC. In this embodiment, the photoresist can remain atop the structure as an upper layer of a multilayered protective coating, or it can be removed immediately after the patterning process.

Next, at least the ARC material is patterned forming the patterned antireflective coatings (ARCs) 14 having at least one opened pattern 16 located therein that exposes portions of the n-type single-crystalline silicon surface 12 of single-crystalline silicon substrate 10. Typically, the opened pattern 16 is in the form of a grid pattern. Alternatively, the opened pattern can also be discontinuously distributed patterns such as dots, pads and lines. Although the cross sectional drawings show the presence of two openings formed into the blanket layer of ARC material, one or a plurality of such openings can be formed providing a grid pattern to the n-type single-crystalline silicon surface 12 of the single-crystalline silicon substrate 10. In one embodiment, the plurality of patterned ARCs 14 can be formed by lithography and etching. The lithographic process includes applying a photoresist (not shown) atop the blanket layer of ARC, exposing the photoresist to a desired pattern of radiation and developing the exposed photoresist utilizing a conventional resist developer. A patterned photoresist is thus provided. The pattern in the photoresist is transferred to the blanket layer of ARC utilizing an etching process such as, for example, dry etching or chemical wet etching. After transferring the pattern from the patterned photoresist to the underlying blanket layer of ARC, the patterned photoresist is typically, but not necessary always, removed from the structure utilizing a conventional resist stripping process such as, for example, ashing. In some embodiments, the above lithographic and etching steps also pattern the blanket layer of protective coating. In another embodiment, the blanket layer of ARC and the optional protective coating can be patterned utilizing ink jet printing or laser ablation.

In some embodiments and as also shown in FIG. 2, an aluminum layer 18 can be formed on the exposed portions of the p-type single-crystalline silicon surface 13 of the single-crystalline silicon substrate 10 by electrodeposition, i.e., electroplating. The aluminum layer 18 that is formed consists essentially of aluminum. Some minor impurities may or may not be introduced into the aluminum layer 18 during the electrodeposition process. In yet another embodiment, the aluminum layer 18 can be formed by screening printing. In yet another embodiment, the aluminum layer 18 can be formed by physical vapor deposition.

The thickness of the aluminum layer 18 that is formed may vary depending on the technique used in forming the same. Typically, the aluminum layer 18 that is formed has a thickness from 0.1 micrometers to 20 micrometers, with a thickness from 0.5 micrometers to 10 micrometers being more typical.

Still referring to FIG. 2, there is also shown the formation of a highly doped p-type single-crystalline silicon region 20 in the p-type single-crystalline silicon portion 10A. In some embodiments, the formation of the highly doped p-type single-crystalline silicon region 20 can be omitted. The term "highly doped" when referring to the highly doped p-type single-crystalline silicon region 20 denotes a p-type dopant concentration of 1E17 atoms/cm$^3$ or greater, with a p-type dopant concentration of from 1E18 atoms/cm$^3$ to 1E22 atoms/cm$^3$ being more typical. In one embodiment, the highly doped p-type single-crystalline silicon region 20 comprises aluminum doped silicon.

When present, the highly doped p-type single-crystalline silicon region 20 can be formed by a thermal treatment of a structure including aluminum layer 18 thereon. The treatment is performed at temperature of 700° C. or above, and more typically, at 800° C. or above. The treatment can be performed in an ambient of oxygen, nitrogen, forming gas, helium, or air, and more typically in air or oxygen. The thickness of the highly doped p-type single-crystalline silicon region 20 is typically from 1 micrometer to 20 micrometers, and more typically from 3 micrometers to 10 micrometers. In other embodiments, the formation of the highly doped p-type single-crystalline silicon 20 can be formed by laser treatment.

It is noted that the order of forming the patterned ARCs 14, the aluminum layer 18 and the optional highly doped p-type single-crystalline silicon layer 20 can vary. For example, the patterned ARCs 14 can be formed first, followed by the aluminum layer 18 and then the highly doped p-type single-crystalline silicon region 20. Alternatively, the aluminum layer 18 and the highly doped p-type single-crystalline silicon region 20 can be formed first, followed by the patterned ARCs 14.

Figure 3:
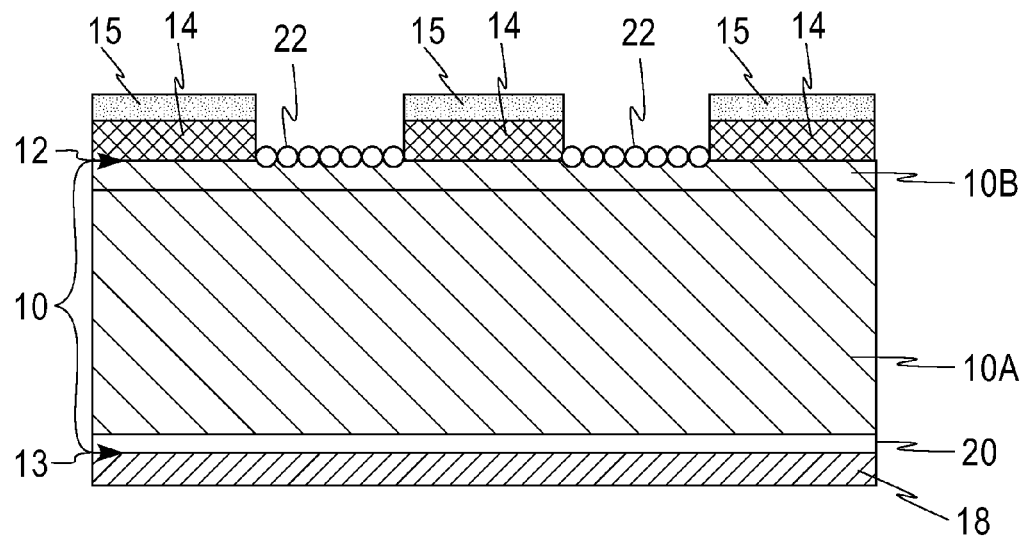
FIG. 3 is a pictorial representation (through a cross sectional view) illustrating the structure of FIG. 2 after forming a plurality of metal nanoparticles on exposed portions of the n-type single-crystalline silicon portion of the single-crystalline silicon substrate that are not covered by the patterned ARCs.

Referring to FIG. 3, there is illustrated the structure of FIG. 2 after forming metal nanoparticles 22 on the exposed portions of the n-type single-crystalline silicon surface 12 that are not covered by patterned ARCs 14. That is, the metal nanoparticles 22 are formed within the opened pattern 16 provided to the blanket ARC material.

The term "metal nanoparticles" is used throughout the present disclosure to denote metal particles that have a particle size that is below 2500 nm. In one embodiment, the metal nanoparticles 22 have a particle size from 10 nm to 1000 nm. In another embodiment, the metal nanoparticles 22 have a particle size from 30 nm to 200 nm.

In one embodiment of the present disclosure, the metal nanoparticles 22 can be formed by electroless plating. Electroless plating is a chemical oxidation-reduction process which depends upon the reduction process of metal ions in an aqueous solution containing a metal salt and the subsequent deposition of a metal while dissolving of silicon oxide from the oxidation of silicon without the use of electrical energy.

In another embodiment of the present disclosure, the metal nanoparticles 22 can be formed by electroplating. Electroplating, i.e., electrodeposition, is a plating process in which metal ions in a solution are moved by an electric field to coat an electrode. The process uses electrical current to reduce cations of a desired material from a solution and coat a conductive object with a thin layer of the material, such as a metal. In electrodeposition, i.e., electroplating, the part to be plated is the cathode of the circuit. In the current disclosure, the exposed upper surface of the single-crystalline silicon substrate 10 is employed as the cathode of the circuit. The anode that is employed in the electroplating process may or may not be made of the same metal as to be plated. The part to be plated, i.e., the single-crystalline silicon substrate 10, can be immersed, completely or in part, in an electroplating bath (e.g., an electrolyte) containing an anode, one or more dissolved metal salts as other ions that permit the flow of electricity. A power supply supplies a direct current to the anode and plating occurs at the cathode (i.e., the exposed surface of the single-crystalline silicon substrate 10).

In yet another embodiment of the present disclosure, the metal nanoparticles 22 can be formed by chemical vapor deposition. In the present disclosure, chemical vapor deposition is a chemical process in which the single-crystalline silicon substrate 10 is exposed to one or more volatile metal precursors, which react and/or decompose on the substrate surface to produce the metal nanoparticles.

In a further embodiment of the present disclosure, the metal nanoparticles 22 can be formed by physical vapor deposition. In the present disclosure, physical vapor deposition includes physical processes such as evaporation or sputtering from a metal source material rather than involving a chemical reaction at the surface of the single-crystalline silicon substrate 10.

In a yet further embodiment of the present disclosure, the metal nanoparticles 22 can be formed by spin coating. In the present disclosure, spin coating includes placing an excess amount of a solution or a suspension or a sol-gel including metal nanoparticles on a surface of the single-crystalline silicon substrate 10. The substrate including the excess solution or suspension or sol-gel is then rotated at a high speed in order to spread the fluid by centrifugal force.

In an even further embodiment, the metal nanoparticles 22 can be formed by drop casting or printing using the same chemicals as for the spin coating method.

The metal nanoparticles 22, which serve as a catalyst in forming openings within the single-crystalline silicon substrate 10, can be comprised of Pt, Ag, Au, Pd, Rh, Ru, Ir, Os, Mo or Ni. In some embodiments, alloys including at least two of the aforementioned metals can be employed as the metal nanoparticles. In one embodiment of the present disclosure, the metal nanoparticles 20 are comprised of Pt. In another embodiment of the present disclosure, the metal nanoparticles 20 are comprised of Ag.

Figure 4:
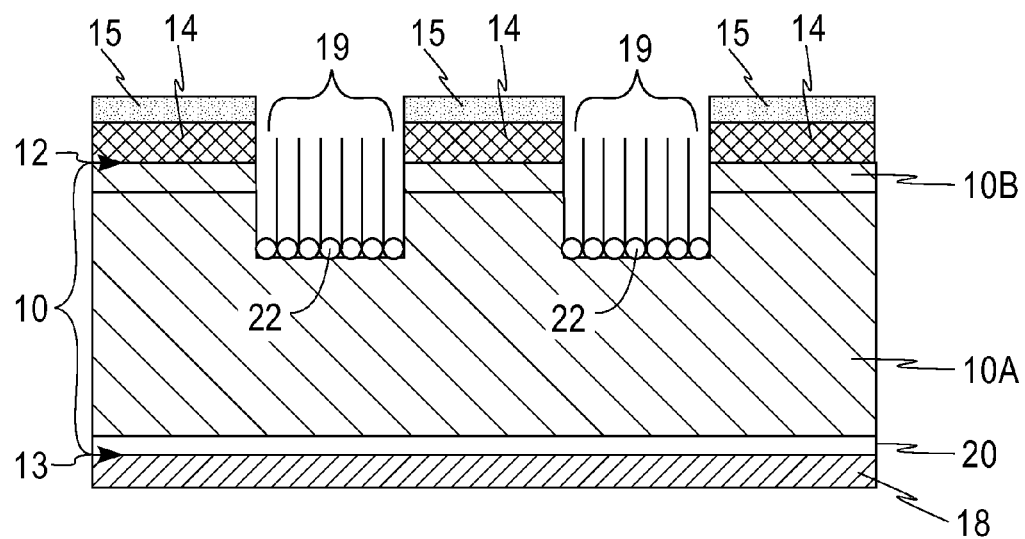
FIG. 4 is a pictorial representation (through a cross sectional view) illustrating the structure of FIG. 3 after performing a metal nanoparticle catalyzed etching process in accordance with one embodiment of the present disclosure.

Referring to FIG. 4, there is illustrated the structure of FIG. 3 after performing a metal nanoparticle catalyzed etching process. In FIG. 4, reference numeral 19 denotes wall portions of the single-crystalline silicon substrate which, in some embodiments, may be present between the metal nanoparticles 22. The metal nanoparticle catalyzed etching process removes portions of the n-type single-crystalline silicon portion 10B and the p-type single-crystalline silicon portion 10A of single-crystalline silicon substrate 10 that are not protected by the patterned ARCs. FIG. 4 represents an embodiment, in which after the metal nanoparticle etching process, the metal nanoparticles 22 are located within a trench and on an exposed surface of the p-type single-crystalline silicon portion 10A of the single-crystalline silicon substrate 10.

In one embodiment, the metal nanoparticle catalyzed etching process, which is anisotropic, includes an etchant that includes at least one fluoride-containing chemical that dissolves silicon oxide such as, but not limited to, HF, $NH_4F$, NaF, or KF, and at least one oxidant such as, but not limited to, $H_2O_2$, $Fe(NO_3)_3$, $K_2Cr_2O_7$, $KMnO_4$, $Na_2S_2O_8$ or $KBrO_3$. In one embodiment of the present disclosure, the metal nanoparticle catalyzed etching process can be performed at room temperature (i.e., a temperature from 20° C.-40° C.). In some embodiments, the metal nanoparticle catalyzed etching process can be performed at a temperature of less than room temperature. For example, and in some embodiments, the less than room temperature metal nanoparticle catalyzed etching process can be performed at a temperature within the range from 1° C. to 19° C. In other embodiments, the metal nanoparticle catalyzed etching process can be performed at a temperature that is greater than room temperature. For example, and in some embodiments, the greater than room temperature metal nanoparticle catalyzed etching process can be performed at a temperature within a range from 41° C. to 95° C. In yet another embodiment, the metal nanoparticle catalyzed etching process can be performed within any combination of the ranges mentioned above.

Figure 5:
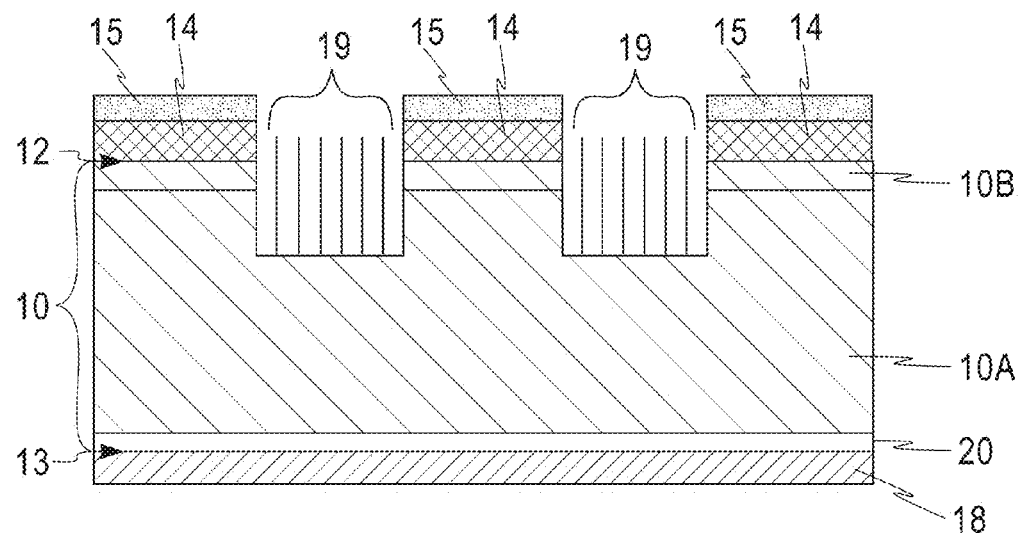
FIG. 5 is a pictorial representation (through a cross sectional view) illustrating the structure of FIG. 4 after removing the metal nanoparticles from the structure.

Referring to FIG. 5, there is illustrated the structure of FIG. 4 after removing the metal nanoparticles 22 from the structure. In one embodiment of the present disclosure, the metal nanoparticles 22 are removed utilizing an etchant solution that includes HCl, $HNO_3$, $H_2Cr_2O_7$, $H_2CrO_4$, $H_2CrO_3$, citric acid, $H_2SO_4$ or $H_2O_2$. In another embodiment of the present disclosure, the metal nanoparticles 22 can be removed at room temperature (i.e., a temperature from 20° C.-40° C.). In some embodiments, the metal nanoparticles 22 can be removed at a temperature of less than room temperature. For example, and in some embodiments, the less than room temperature metal nanoparticles 22 removal process can be performed at a temperature within the range from 1° C. to 19° C. In other embodiments, the metal nanoparticles 22 can be removed at a temperature that is greater than room temperature. For example, and in some embodiments, the greater than room temperature metal nanoparticles 22 removal can be performed at a temperature within a range from 41° C. to 95° C. In yet another embodiment, the metal nanoparticles 22 removal process can be performed within any combinations of the ranges mentioned above.

Figure 6:
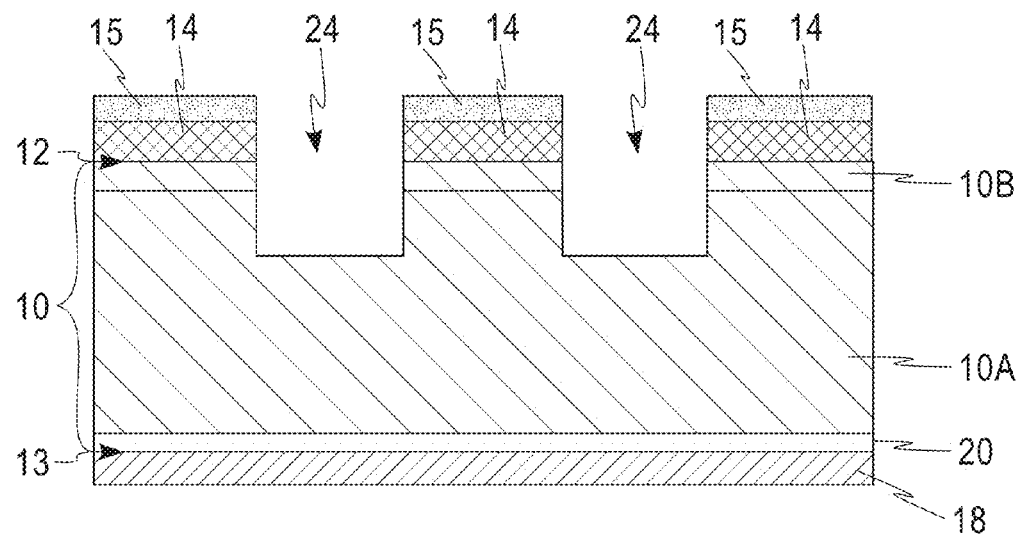
FIG. 6 is a pictorial representation (through a cross sectional view) illustrating the structure of FIG. 5 after removing possible wall material that may be present between the metal nanoparticles after performing the metal nanoparticle catalyzed etching process.

Referring now to FIG. 6, there is illustrated the structure of FIG. 5 after removing possible wall portions 19 of the single-crystalline silicon substrate that can be present between the metal nanoparticles 22 after performing the metal nanoparticle catalyzed etching process. In FIG. 6, reference numeral 24 denotes a trench that is formed into the single-crystalline silicon substrate 10.

If present the wall portions 19 of the single-crystalline silicon substrate can be removed from the structure utilizing an acidic etchant such as, for example, a mixture of $HNO_3$ and HF with optional acetic acid. In another embodiment, the possible wall portions 19 of the single-crystalline silicon substrate can be removed from the structure utilizing an alkaline etchant including, but not limited to, KOH or NaOH. When an acidic etchant is employed, the acidic etching process may leave porous silicon behind, which can be removed by utilizing an alkaline etching prior to emitter formation.

In some embodiments, the possible wall portions 19 of the single-crystalline silicon substrate might be removed during the removal of the metal nanoparticles 22, as such, the above etching step illustrated in FIG. 6 can be omitted.

As is illustrated in FIG. 6, each trench 24 has sidewall surfaces which are in communication with a bottom surface. The bottom surface of each trench includes a horizontal portion of the p-type doped single-crystalline silicon portion 10A, while the sidewall surfaces comprise a combination of a vertical portion of the p-type doped single-crystalline silicon portion 10A and a vertical portion of the n-type doped single-crystalline silicon portion 10B. Each trench 24 that is formed typically has a depth up to 50 µm, with a depth of 2 µm to 30 µm being more typical.

Next, the exposed sidewall surfaces and the bottom surface of the single-crystalline silicon substrate 10 that are located within the trenches 24 are cleaned to remove any oxide therefrom. In one embodiment, diluted hydrofluoric acid can be used to remove any oxide contaminate from the exposed sidewall surfaces and the bottom surface of the single-crystalline silicon substrate 10 that are located within the trenches 24.

Figure 7:
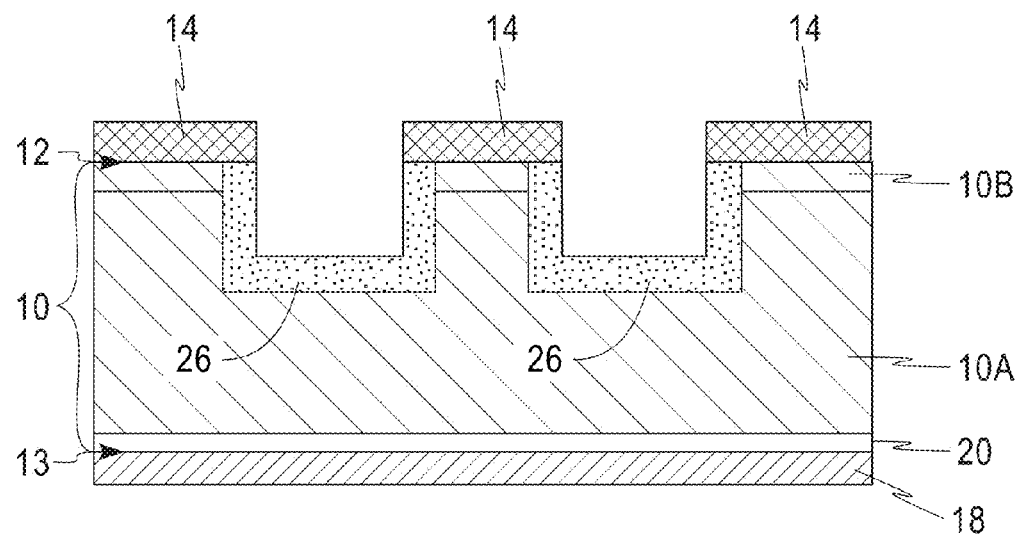
FIG. 7 is a pictorial representation (through a cross sectional view) illustrating the structure of FIG. 6 after forming an emitter region within exposed portions of the single-crystalline silicon substrate.

Referring now to FIG. 7, there is illustrated the structure of FIG. 6 after removing the optional protective coating 15 and forming an emitter region 26 within exposed portions of the single-crystalline silicon substrate 10 that are located in each trench 24. The optional protective coating 15 can be removed by processes including wet etching and plasma etching. A typical protective coating 15 as photoresist can be removed by organic solvent including acetone. This optional protective coating 15 can be removed before or after the removal of metal nanoparticles 22, or after the removal of the possible wall portions 19.

As is illustrated in FIG. 7, the emitter region 26 that is formed is U-shaped. The emitter region 26 is formed by doping the exposed portions of the single-crystalline silicon substrate 10 that are located in each trench 24 with an n-type dopant. A p-type dopant would be used in the embodiment in which an n-type silicon photovoltaic device is employed with a p-type emitter. The n-type dopant can be the same or different, typically, the same, as that of the n-type single-crystalline silicon portion 10B of the single-crystalline silicon substrate 10. In one embodiment, the n-type dopant concentration within the emitter region 26 is from 1E16 atoms/$cm^3$ to 1E22 atoms/$cm^3$. In another embodiment, the n-type dopant concentration within the emitter region 26 is from 1E18 atoms/$cm^3$ to 1E22 atoms/$cm^3$.

The emitter region 26 can be formed by ion implantation, gas phase doping, or out-diffusion from a sacrificial n-type dopant source material that can be formed within each of the trenches and then removed after a performing a diffusion anneal. When ion implantation is employed, the ion implantation can be an angled ion implantation process. Typically after ion implantation, a thermal anneal is used to activate the implanted n-type dopant.

Figure 8:
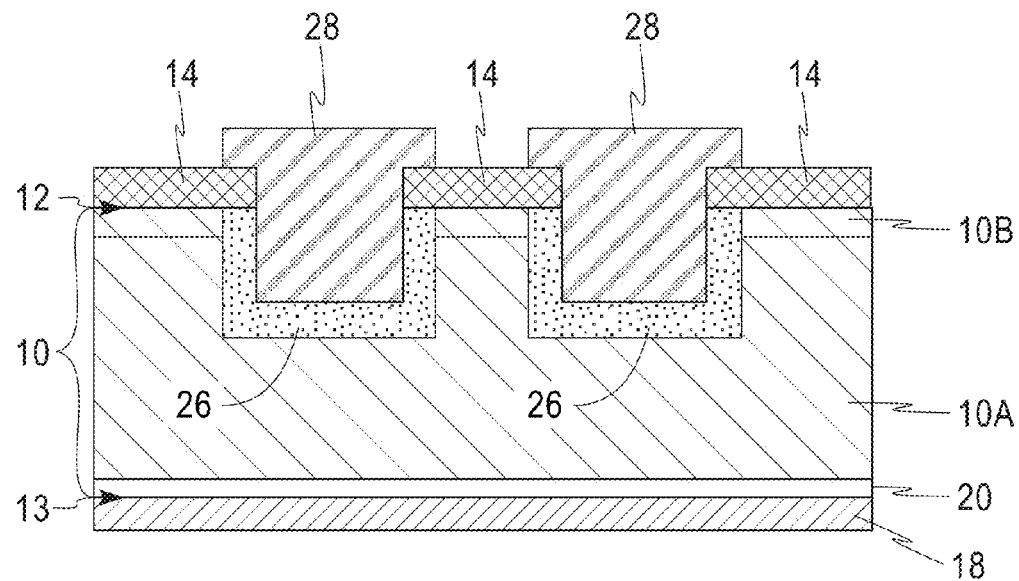
FIG. 8 is a pictorial representation (through a cross sectional view) illustrating the structure of FIG. 7 after forming a metal contact atop the emitter region.

Referring to FIG. 8, there is illustrated the structure of FIG. 7 after forming a metal contact 28 atop the emitter region 26 and at least within each trench 24. In some embodiments and as shown in FIG. 8, the metal contact 28 extends on to an upper surface of at least one adjacent patterned ARC 14. In other embodiments (not shown), the metal contact 28 does not extend on to an upper surface of at least one adjacent patterned ARC 14. In such an embodiment, the metal contact 28 can have a topmost surface that is above a topmost surface of each patterned ARC 14. Also and in such an embodiment, the metal contact 28 can have a topmost surface that is coplanar to a topmost surface of each patterned ARC 14. Further and in such an embodiment, the metal contact 28 can have a topmost surface that is located beneath a topmost surface of each patterned ARC 14.

The metal contact 28 can include any metal or metal alloys such as, for example, Ni, Co, Cu, Zn, Pt, Ag, Pd, Sn, Fe, In or alloys thereof. Typically, the metal contact 28 can be comprised of Ni or Cu or alloys thereof. More typically, the metal contact 28 is comprised of Ni or a Ni alloy.

In one embodiment, the metal contact 28 can be formed by electroplating. In another embodiment, the metal contact 28 can be formed by screening printing.

When electroplating is employed, any conventional electroplating apparatus that is well known to those skilled in the art can be used. Electrodeposition, i.e., electroplating, is a plating process in which metal ions in a solution are moved by an electric field to coat an electrode. The process uses electrical current to reduce cations of a desired material from a solution and coat a conductive object with a thin layer of the material, such as a metal. In electrodeposition, i.e., electroplating, the part to be plated is the cathode of the circuit. In the current disclosure, the exposed surface of the emitter region 26 is employed as the cathode of the circuit. The anode that is employed in the electrodeposition process may or may not be made of the same metal as to be plated. In the present disclosure, the structure shown in FIG. 7 is immersed in an electroplating bath (e.g., an electrolyte) containing an anode and one or more dissolved metal salts (to be further defined here below) as well as other ions that permit the flow of electricity. A power supply supplies a direct current to the anode and plating occurs at the cathode (i.e., the exposed surface of the emitter region 26.

The electroplating bath that can be employed in the present disclosure includes one or more sources of metal ions, to plate metals. The one or more sources of metal ions provide metal ions which include, but are not limited to, Ni, Co, Cu, Zn, Pt, Ag, Pd, Sn, Fe and In. Alloys that can be electrodeposited (or plated) include, but are not limited to, binary and ternary alloys of the foregoing metals. In one embodiment, metals chosen from Ni, Co, Cu, Zn, Pt and Fe are plated from the electroplating bath. In another embodiment, Cu or a Cu alloy is plated from the electroplating bath.

The one or more sources of metal ions that can be present in the electroplating bath include metal salts. The metal salts that can be used include, but are not limited to, metal halides, metal nitrates, metal sulfates, metal sulfamates, metal alkane sulfonates, metal alkanol sulfonate, metal pyrophosphates, metal cyanides, metal acetates or metal citrates.

In general, the metal salts are included in the electroplating bath such that metal ions range in concentrations from 0.001 mole/L to 2 mole/L, or such as from 0.005 mole/L to 1.5 mole/L. Typically, metal salts are included in amount such that metal ion concentration range from 0.01 to 1.5 mole/L, more typically from 0.1 mole/L to 1 mole/L.

The electroplating bath that can be used may include one or more conventional diluents. Typically, the electroplating bath is aqueous; however, conventional organic diluents may be used if desired. Optional conventional electroplating bath additives also may be included. Such additives include, but are not limited to, one or more of brighteners, suppressors, surfactants, inorganic acids, organic acids, brightener breakdown inhibition compounds, alkali metal salts, and pH adjusting compounds.

One or more inorganic and organic acids can be also included in the electroplating bath to increase the solution conductivity of the matrix and also to adjust the pH of the plating composition. Inorganic acids include, but are not limited to, sulfuric acid, hydrochloric acid, nitric acid and phosphoric acid. Organic acids include, but are not limited to, alkane sulfonic acids, such a methane sulfonic acid. Acids are included in the electroplating bath in conventional amounts.

Alkali metal salts which may be included in the electroplating bath include, but are not limited to, sodium and potassium salts of halogens, such as chloride, fluoride and bromide. Typically chloride is used. Such alkali metal salts are used in conventional amounts.

The measured pH of the electroplating bath may range from −1 to 14, or such as from −1 to 8. Typically, the pH of the electroplating bath ranges from −1 to 5, more typically, from 0 to 4. Conventional buffering compounds may be included to control the pH of the electroplating bath. The electroplating baths are typically maintained in a temperature range of from 20° C. to 110° C., with a temperature from 20° C. to 50° C. being more typical. Plating temperatures may vary depending on the metal to be plated.

The electrodeposition process employed in forming the metal contacts 28 uses current waveforms that are well known to those skilled in the art. In one embodiment, the current waveform can include a high current density initially, and after a predetermined period of time, the current density can be decreased to a lower current density. In another embodiment, the current waveform can include a low current density initially, and after a predetermined period of time, the current density can be increased to a higher current density. In yet another embodiment, a single waveform can be employed to plate the metal contacts 28.

By "low current density" it is meant a plating density within a range from 1 mAmps/cm$^2$ to 40 mAmps/cm$^2$. By "high current density" it is meant a plating density of greater than 20 mAmps/cm$^2$. A general range for the high current density regime is from greater than 20 mAmps/cm$^2$ to 200 mAmps/cm$^2$.

The increase from the low current density regime to the high current density regime or decrease from the high current density regime to the low current density regime may include a continuous ramp or it may include various ramp and soak cycles including a sequence of constant current plateaus.

In some embodiments of the present disclosure, light illumination can be used during the electrodeposition process. In particular, light illumination can be used in embodiments in which solar or photovoltaic cells are to be fabricated to generate free electrons that can be used during the electrodeposition process. When light illumination is employed during the electrodeposition process, any conventional light source or light emitting diodes can be used. The intensity of the light employed may vary and is typically greater than 50 W/m$^2$, with an intensity of light from 100 W/m$^2$ to 500 W/m$^2$ being more typical. The combination of the aforementioned waveform and light illumination enables one to provide complete coverage of a metallic film on the surface of a semiconductor substrate used in solar cell applications.

The thickness of the metal contact 28 that is formed may vary depending. Typically, the metal contact 28 that is formed has a thickness from 10 nm to 50 μm, with a thickness from 50 nm to 20 μm being more typical.

While the present disclosure has been particularly shown and described with respect to various embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a photovoltaic device comprising:
    forming a plurality of metal nanoparticles on exposed portions of a single-crystalline silicon substrate that are not covered by patterned antireflective coatings (ARCs);
    forming trenches within the exposed portions of the single-crystalline silicon substrate by utilizing a metal nanoparticle catalyzed etching process;
    removing the metal nanoparticles from the trenches;
    forming an emitter region within exposed wall portions of the single-crystalline silicon substrate; and
    forming a metal contact atop the emitter region.

2. The method of claim 1, wherein said single-crystalline silicon substrate comprises a p-type single-crystalline silicon portion and an n-type single-crystalline silicon portion one atop the other.

3. The method of claim 2, wherein said n-type single-crystalline silicon portion is located atop the p-type single-crystalline silicon portion.

4. The method of claim 3, wherein said p-type single-crystalline silicon portion includes an aluminum layer located on an exposed surface thereof.

5. The method of claim 4, further comprising a highly doped p-type single-crystalline silicon region located beneath a surface of the p-type single-crystalline silicon portion, said highly doped p-type single-crystalline silicon region having a p-type dopant concentration of 1e17 atoms/cm$^3$ or greater.

6. The method of claim 1, wherein said plurality of patterned antireflective coatings is formed by depositing a blanket layer of antireflective coating material on a surface of the single-crystalline silicon substrate and then patterning the blanket layer of antireflective coating material by lithography and etching.

7. The method of claim 1, wherein said forming the plurality of metal nanoparticles comprises electroless plating, electroplating, physical vapor deposition, chemical vapor deposition, spin-coating, drop casting, or printing.

8. The method of claim 1, wherein said forming the plurality of metal nanoparticles comprises selecting at least one of Pt, Ag, Au, Pd, Rh, Ru, Ir, Os, Mo and Ni.

9. The method of claim 1, wherein said metal nanoparticle catalyzed etching process comprises contacting with an etchant comprising a fluoride-containing chemical.

10. The method of claim 9, wherein said etchant further comprising $H_2O_2$, $Fe(NO_3)_3$, $K_2Cr_2O_7$, $KMnO_4$, $Na_2S_2O_8$ or $KBrO_3$ as an oxidant.

11. The method of claim 1, wherein said removing the metal nanoparticles comprises contacting with an etching solution comprising HCl, $HNO_3$, $H_2Cr_2O_7$, $H_2CrO_4$, $H_2CrO_3$, citric acid, $H_2SO_4$ or $H_2O_2$.

12. The method of claim 1, wherein said exposed wall portions of the single-crystalline silicon semiconductor substrate includes a vertical surface of an n-type single-crystalline silicon portion of the single-crystalline silicon substrate, a vertical surface of a p-type single-crystalline silicon portion of the single-crystalline silicon substrate, and a horizontal surface of the p-type single-crystalline silicon portion of the single-crystalline silicon substrate.

13. The method of claim 1, wherein said forming the emitter region comprises ion implantation, gas phase doping or out-diffusion from a dopant source material.

14. The method of claim 1, wherein said emitter region is n-type doped, and has a n-type dopant concentration from 1E16 atoms/cm$^3$ to 1E22 atoms/cm$^3$.

15. The method of claim 1, wherein said forming the metal contact comprises selecting at least one of Ni, Co, Cu, Zn, Pt, Ag, Pd, Sn, Fe and In.

16. The method of claim 1, wherein said forming the metal contact comprises electroplating or screen printing.

17. The method of claim 1, wherein each of said patterned ARCs includes a protective layer located thereon, and said protective layer is removed from each of said patterned ARCs after said trenches are formed.

18. The method of claim 17, wherein said protective layer comprises at least one of a photoresist, an organic material and a dielectric material.

19. A method of forming a photovoltaic device comprising:
providing a single-crystalline silicon substrate having an n-type single-crystalline silicon portion and a p-type single-crystalline silicon portion located one atop another, wherein said n-type single-crystalline silicon portion has an n-type single-crystalline silicon surface and said p-type single-crystalline silicon portion has a p-type single-crystalline silicon surface;
forming a plurality of patterned antireflective coatings (ARCs) on portions of the n-type single-crystalline silicon surface, while leaving other portions of the n-type single-crystalline silicon surface exposed;
forming a plurality of metal nanoparticles on the other portions of the n-type single-crystalline silicon surface that are exposed;
forming trenches within the other portions of the n-type single-crystalline silicon surface that are exposed by utilizing a metal nanoparticle catalyzed etching process, said trenches extending into the n-type single-crystalline silicon portion and the p-type single-crystalline silicon portion of the single-crystalline silicon substrate;
removing the metal nanoparticles from the trenches;
forming an n-type emitter region within exposed wall portions of the n-type single-crystalline silicon portion and the p-type single-crystalline silicon portion of the single-crystalline silicon substrate; and
forming a metal contact atop the n-type emitter region.

20. The method of claim 19, wherein said p-type single-crystalline silicon surface further includes an aluminum layer located thereon.

21. The method of claim 20, further comprising a highly doped p-type single-crystalline silicon region located beneath the p-type single-crystalline silicon surface, said highly doped p-type single-crystalline silicon region having a p-type dopant concentration of 1e17 atoms/cm$^3$ or greater.

22. The method of claim 19, wherein said forming the plurality of metal nanoparticles comprises electroless plating, electroplating, physical vapor deposition, chemical vapor deposition, spin-coating, drop casting, or printing and selecting at least one of Pt, Ag, Au, Pd, Rh, Ru, Ir, Os, Mo and Ni.

23. The method of claim 19, wherein said metal nanoparticle catalyzed etching process comprises contacting with an etchant comprising a fluoride-containing chemical.

24. The method of claim 23, wherein said etchant further comprising $H_2O_2$, $Fe(NO_3)_3$, $K_2Cr_2O_7$, $KMnO_4$, $Na_2S_2O_8$ or $KBrO_3$ as an oxidant.

25. The method of claim 19, wherein said removing the metal nanoparticles comprises contacting with an etching solution comprising HCl, $HNO_3$, $H_2Cr_2O_7$, $H_2CrO_4$, $H_2CrO_3$, citric acid, $H_2SO_4$ or $H_2O_2$.

26. The method of claim 19, wherein each of said patterned ARCs includes a protecting layer located thereon, and said protecting layer is removed from each of said patterned ARCs after said trenches are formed.

27. The method of claim 26, wherein said protective layer comprises at least one of a photoresist, an organic material and a dielectric material.

* * * * *